(12) United States Patent
Su et al.

(10) Patent No.: US 10,505,007 B1
(45) Date of Patent: Dec. 10, 2019

(54) SEMICONDUCTOR DEVICE HAVING ASYMMETRIC WORK FUNCTION METAL LAYER

(71) Applicant: UNITED MICROELECTRONICS CORP., Hsin-Chu (TW)

(72) Inventors: Po-Wen Su, Kaohsiung (TW); Wen-Yen Huang, Changhua County (TW); Kuan-Ying Lai, Chiayi (TW); Shui-Yen Lu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/133,685

(22) Filed: Sep. 17, 2018

(30) Foreign Application Priority Data

Aug. 8, 2018 (CN) .......................... 2018 1 0896433

(51) Int. Cl.
*H01L 21/00* (2006.01)
*H01L 29/49* (2006.01)
*H01L 21/28* (2006.01)
*H01L 29/08* (2006.01)
*H01L 29/66* (2006.01)
*H01L 21/033* (2006.01)
*H01L 21/8238* (2006.01)

(52) U.S. Cl.
CPC ...... *H01L 29/4966* (2013.01); *H01L 21/0337* (2013.01); *H01L 21/28088* (2013.01); *H01L 21/823842* (2013.01); *H01L 29/0847* (2013.01); *H01L 29/66545* (2013.01)

(58) Field of Classification Search
CPC ......... H01L 29/4966; H01L 21/823842; H01L 21/0337
See application file for complete search history.

(56) References Cited

U.S. PATENT DOCUMENTS 8,669,618 B2 * 3/2014 Fu ..................... H01L 21/28088
257/368

* cited by examiner

*Primary Examiner* — Laura M Menz
(74) *Attorney, Agent, or Firm* — Winston Hsu

(57) ABSTRACT

A semiconductor device includes a metal gate on a substrate, in which the metal gate includes a first work function metal (WFM) layer and the first WFM layer further includes a first vertical portion, a second vertical portion, wherein the first vertical portion and the second vertical portion comprise different heights, and a first horizontal portion connecting the first vertical portion and the second vertical portion.

14 Claims, 8 Drawing Sheets

SEMICONDUCTOR DEVICE HAVING ASYMMETRIC WORK FUNCTION METAL LAYER

BACKGROUND OF THE INVENTION

1. Field of the Invention

The invention relates to a semiconductor device, and more particularly to a semiconductor device having asymmetrical work function metal layer.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal transistor having different sizes, multiple layers of work function metal layers have been found to be unable to fill into trenches having smaller pitches thereby affecting the performance of the device. Hence, how to resolve this issue has become an important task in this field.

SUMMARY OF THE INVENTION

According to an embodiment of the present invention, a semiconductor device includes a metal gate on a substrate, in which the metal gate includes a first work function metal (WFM) layer and the first WFM layer further includes a first vertical portion, a second vertical portion, wherein the first vertical portion and the second vertical portion comprise different heights, and a first horizontal portion connecting the first vertical portion and the second vertical portion.

According to another aspect of the present invention, a semiconductor device includes a metal gate on a substrate and the metal gate further includes: a first work function metal (WFM) layer, wherein the first WFM layer comprises a first U-shape and the first U-shape comprises a first end and a second end; and a second WFM layer on the first WFM layer, wherein the second WFM layer comprise a second U-shape, the second U-shape comprises a third end and a fourth end, top surfaces of the first end and the third end are coplanar, top surfaces of the second end and the fourth end are coplanar, and the first end is lower than the second end.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
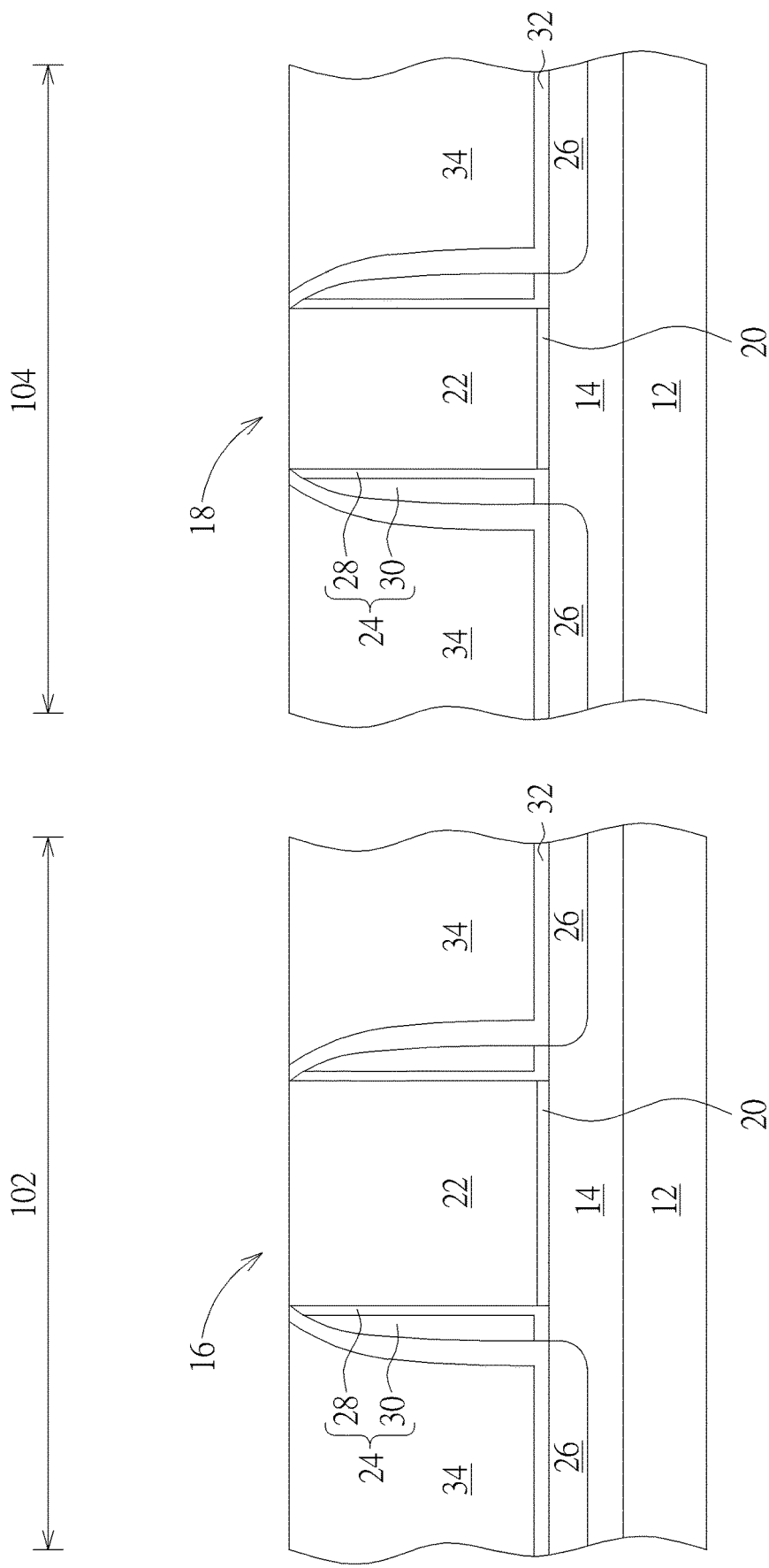
FIGS. 1-3 illustrate a method for fabricating semiconductor device according to an embodiment of the present invention.
Figure 2:
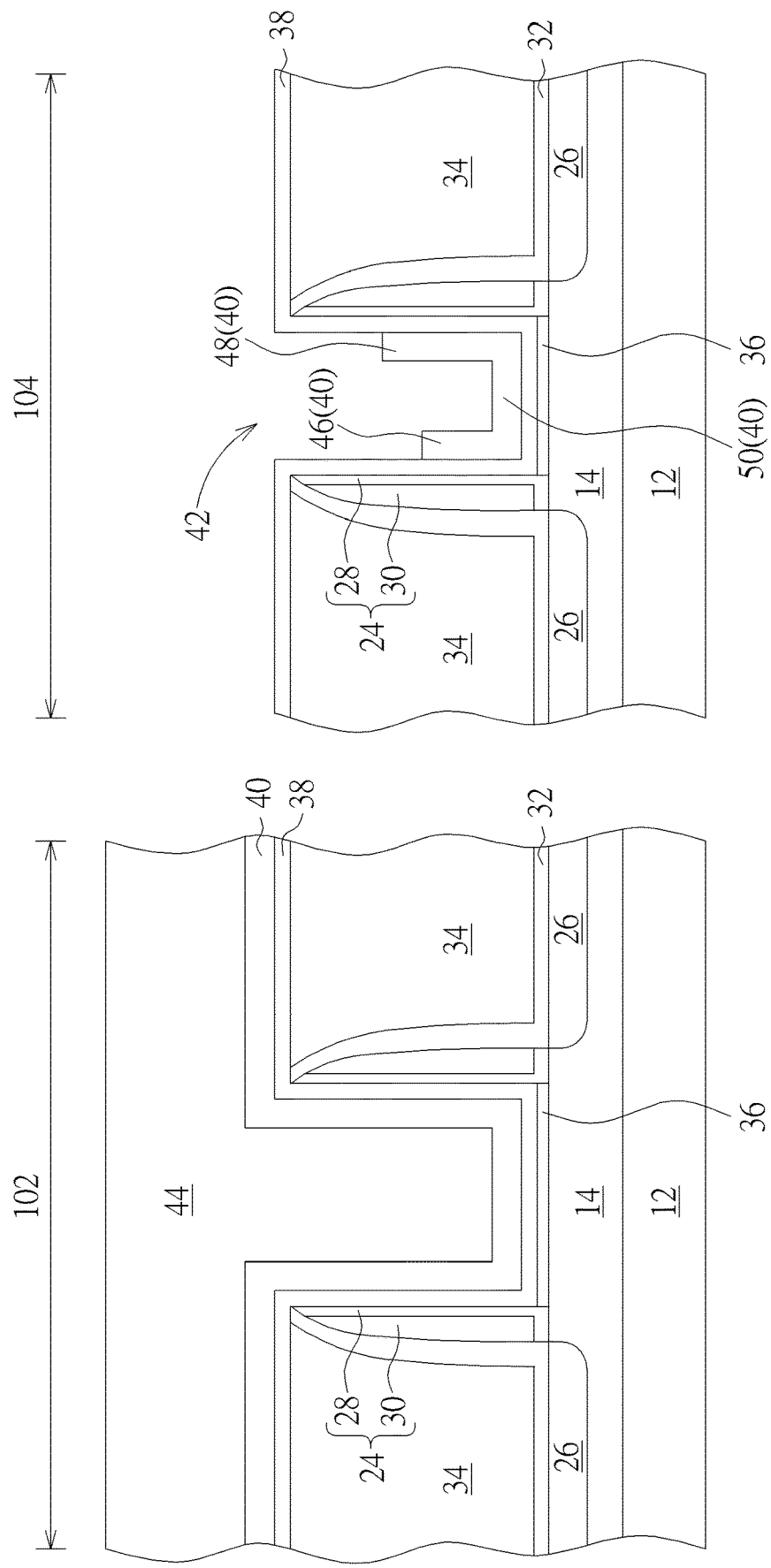
Figure 3:
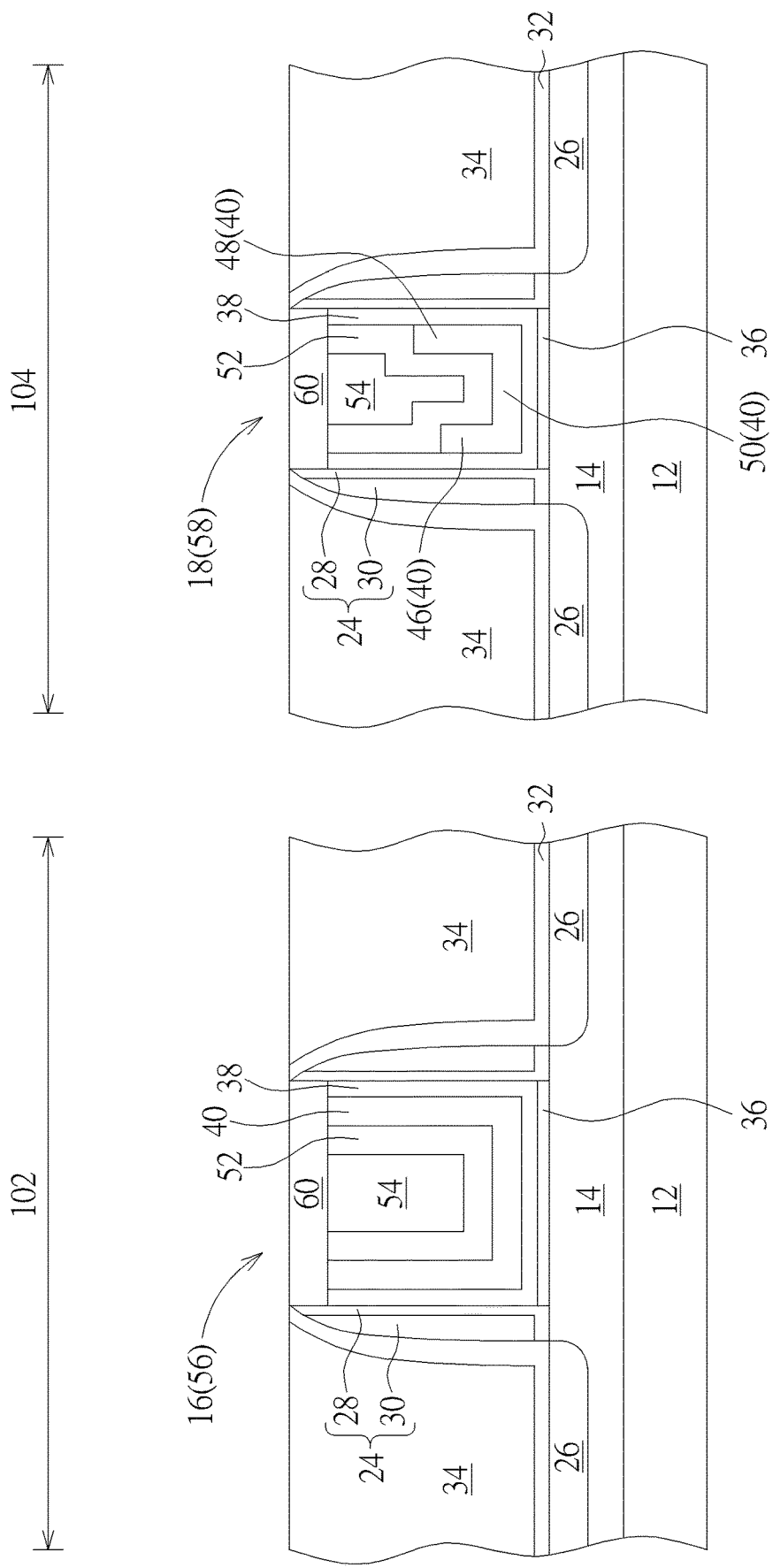

Referring to FIGS. 1-3, FIGS. 1-3 illustrate a method for fabricating semiconductor device according to an embodiment of the present invention. As shown in FIG. 1, a substrate 12 is first provided, in which the substrate could be a silicon substrate or silicon-on-insulator (SOI) substrate. A first region 102 and a second region 104 are defined on the substrate 12, in which the first region 102 is preferably defined to fabricate MOS transistors with greater size or pith in the later process while the second region 104 is defined to fabricate MOS transistors having smaller size in the later process. Preferably, the width of the gate structure or metal gate formed on the second region 104 in the later process is smaller than the width of the gate structure or metal gate on the first region 102. It should also be noted that both the first region 102 and the second region 104 are preferably used to fabricate MOS transistors having same conductive type, in which both the first region 102 and the second region 104 are either PMOS regions or NMOS regions, which are all within the scope of the present invention. At least a fin-shaped structure 14 is formed on the substrate 12, in which the bottom portion of the fin-shaped structure 14 is surrounded by an insulating layer or shallow trench isolation (STI) preferably made of material such as silicon oxide. It should be noted that even though this embodiment pertains to the fabrication of a non-planar FET device such as FinFET device, it would also be desirable to apply this content of the following process to a planar FET device, which is also within the scope of the present invention.

According to an embodiment of the present invention, the fin-shaped structure 14 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 14 could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, at least gate structures 16 and 18 or dummy gates are formed on the first region 102 and second region 104 on the substrate 12 respectively. In this embodiment, the formation of the gate structures 16 and 18 could be accomplished by a gate first process, a high-k first approach from gate last process, or a high-k last approach from gate last process. Since this embodiment pertains to a high-k last approach, a gate dielectric layer 20 or interfacial layer, a gate material layer 22 made of polysilicon, and a selective hard mask (not shown) could be formed sequentially on the substrate 12, and a pattern transfer process is then conducted by using a patterned resist (not shown) as mask to remove part of the gate material layer 22 and part of the gate dielectric layer 20 through single or multiple etching processes. After stripping the patterned resist, gate structures 16, 18 each composed of a patterned gate dielectric layer 20 and patterned material layer 22 are formed on the substrate 12. In this embodiment, the width of the gate structure 18 disposed on the second region 104 is preferably less than the width of the gate structure 16 on the first region 102.

Next, at least a spacer 24 is formed on the sidewalls of each of the gate structures 16 and 18, a source/drain region 26 and/or epitaxial layer (not shown) is formed in the substrate 12 adjacent to two sides of the spacers 24, and a selective silicide layer (not shown) could be formed on the surface of the source/drain region 26. In this embodiment, each of the spacers 24 could be a single spacer or a composite spacer, such as a spacer including but not limited to for example an offset spacer 28 and a main spacer 30. Preferably, the offset spacer 28 and the main spacer 30 could include same material or different material while both the offset spacer 28 and the main spacer 30 could be made of material including but not limited to for example $SiO_2$, SiN, SiON, SiCN, or combination thereof. The source/drain regions 26 could include n-type dopants or p-type dopants depending on the type of device being fabricated.

Next, a contact etch stop layer (CESL) 32 is formed on the substrate 12 surface and the gate structures 16 and 18, and an interlayer dielectric (ILD) layer 34 is formed on the CESL 32 afterwards. Next, a planarizing process such as a chemical mechanical polishing (CMP) process is conducted to remove part of the ILD layer 34 and part of the CESL 32 to expose the gate material layer 22 composed of polysilicon so that the top surfaces of the gate material layer 22 and ILD layer 34 are coplanar.

Next, as shown in FIG. 2, a replacement metal gate (RMG) process is conducted to transform the gate structures 16, 18 into metal gates. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 22 or even gate dielectric layer 20 from gate structures 16, 18 for forming a recess 42 in the ILD layer 34 on each of the first region 102 and the second region 104.

Next, a selective interfacial layer 36 or gate dielectric layer, a high-k dielectric layer 38, and a work function metal (WFM) layer 40 are formed in the recesses 42 on the first region 102 and second region 104, a patterned mask 44 is formed to cover the first region 102 and expose the work function metal layer 40 on the second region 104, and an etching process is conducted by using the patterned mask 44 as mask to remove part of the work function metal layer 40 so that the tip of the remaining work function metal layer 40 is slightly lower than the top surface of the ILD layer 34 or the recess 42.

In this embodiment, the etching process conducted to remove part of the work function metal layer 40 preferably includes a wet etching process and an etchant applied through the wet etching process preferably includes chlorine or more specifically the etchant could be selected from the group consisting of hydrochloric acid (HCl) and hydrogen peroxide ($H_2O_2$). It should be noted that a spinning process is conducted on the substrate 12 semiconductor wafer during the aforementioned wet etching process, in which the spinning process preferably spins a single semiconductor wafer or substrate 12 instead of spinning multiple or a batch of wafers. Since the wet etching process is conducted while the substrate 12 or semiconductor wafer is being spun, the deposited work function metal layer 40 would eventually form an asymmetric structure as a result of the centrifugal force from the spinning process. Specifically, the work function metal layer 40 after the etching process preferably includes a vertical portion 46 on one side of the recess 42, a vertical portion 48 on another side of the recess 42, and a horizontal portion 50 connecting the vertical portion 46 and the vertical portion 48, in which the vertical portion 46 and the vertical portion 48 have different heights, the lower vertical portion 46 is preferably closer to a center of the wafer while the higher vertical portion 48 is closer to an edge of the wafer.

Next, as shown in FIG. 3, the patterned mask 44 is removed from the first region 102, another work function metal layer 52 and a low resistance metal layer 54 are formed in the recesses 42 on the first region 102 and second region 104 to fill the recesses 42 completely, and a planarizing process such as CMP is conducted to remove part of the low resistance metal layer 54, part of the work function metal layer 52, part of the work function metal layer 40, and part of the high-k dielectric layer 38 on the first region 102 and part of the low resistance metal layer 54, part of the work function metal layer 52, and part of the high-k dielectric layer 38 on the second region 104 for forming metal gates 56, 58 on the first region 102 and second region 104 respectively. Similar to the size of the gate structures before the RMG process, the width of the metal gate 58 on the second region 104 is slightly less than the width of the metal gate 56 on the first region 102. Next, another etching process is conducted to remove part of the metal gates 56, 58 on the first region 102 and second region 104 to form recesses (not shown), a hard mask 60 made of dielectric material such as silicon nitride is formed in the recesses on top of the metal gates 56, 58, and a planarizing process such as CMP is conducted to remove part of the hard mask 60 so that the top surface of the remaining hard masks 60 is even with the top surface of the ILD layer 34. Next, contact plugs could be formed adjacent to two sides of each of the metal gates 56, 58 to directly contact the source/drain regions 26 depending on the demand of the process. This completes the fabrication of a semiconductor device according to an embodiment of the present invention.

Figure 4:
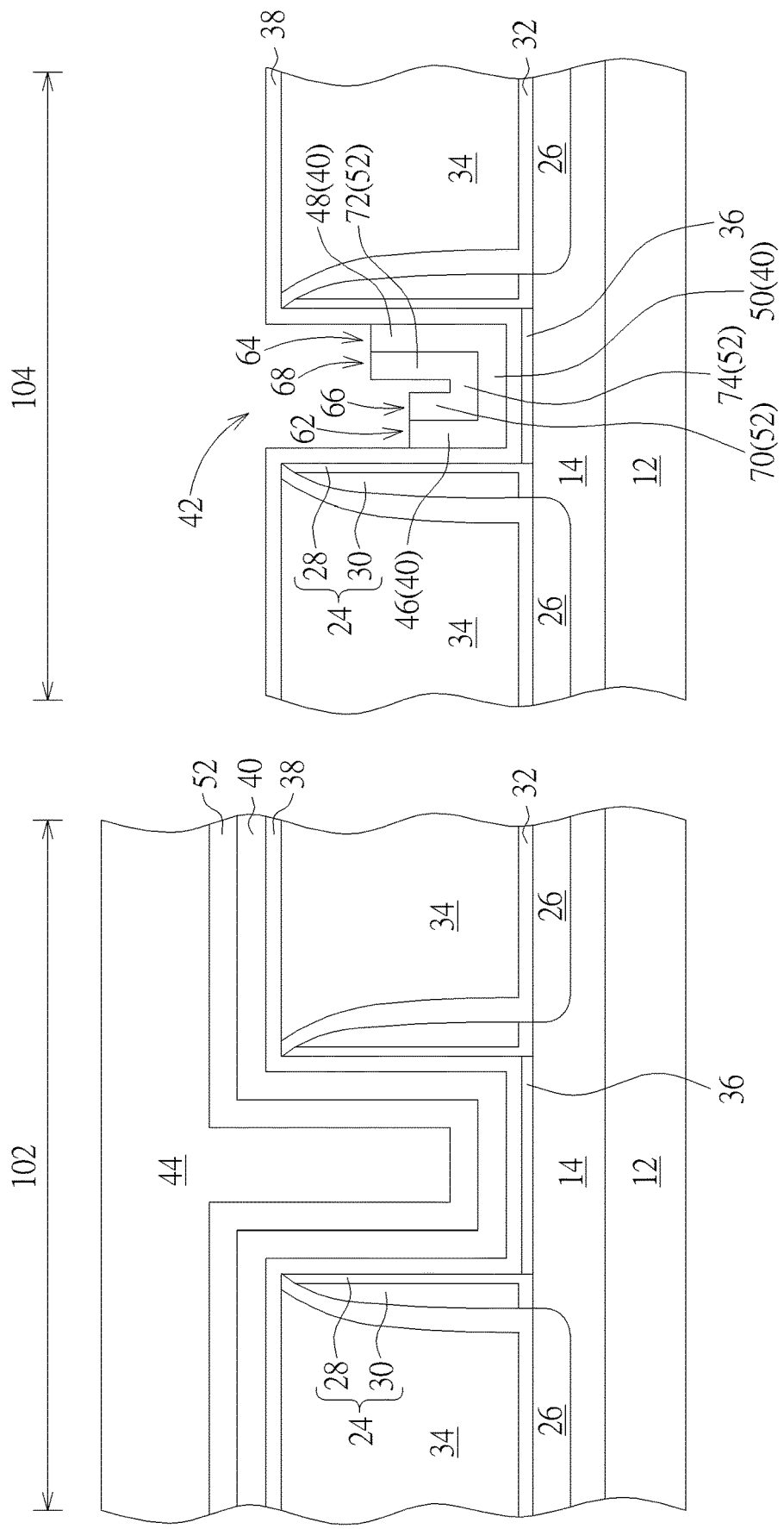
FIGS. 4-5 illustrate a method for fabricating a semiconductor device according to an embodiment of the present invention.
Figure 5:
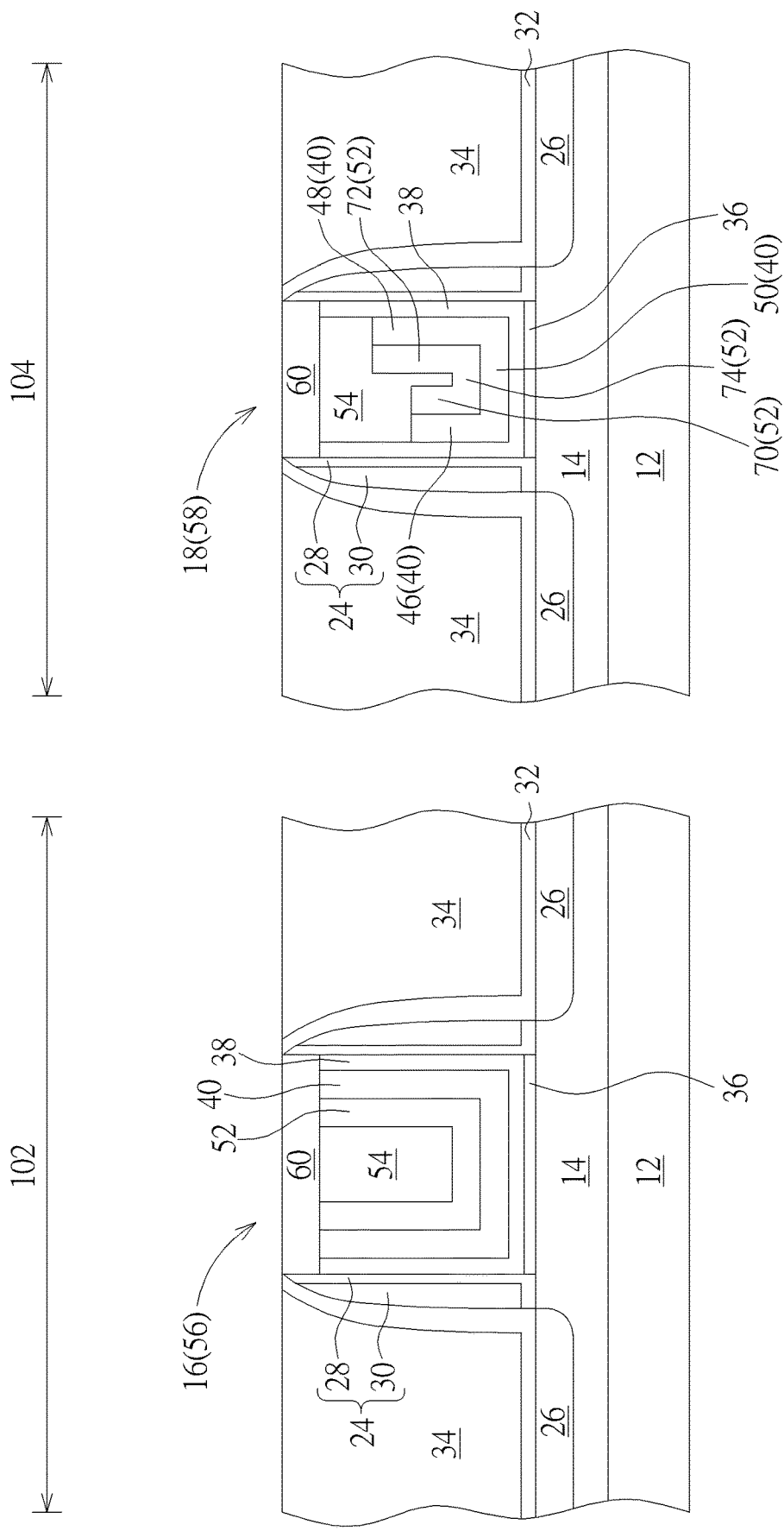

Referring to FIGS. 4-5, FIGS. 4-5 illustrate a method for fabricating a semiconductor device according to an embodiment of the present invention. As shown in FIG. 4, after the recesses 42 are formed in FIG. 2, it would be desirable to sequentially form a selective interfacial layer 36 or gate dielectric layer, a high-k dielectric layer 38, a work function metal layer 40, and another work function metal layer 52 into the recesses 42, form a patterned mask 44 to cover the first region 102 and expose the work function metal layer 52 on the second region 104, and then using the patterned mask 44 as mask to remove part of the work function metal layer 52 and part of the work function metal layer 40 on the ILD layer 34 so that the remaining work function metal layers 52, 40 are slightly lower than the top surface of the ILD layer 34 or recesses 42.

Similar to the embodiment shown in FIG. 3, the etching process conducted at this stage to remove part of the work function metal layers 40, 52 preferably includes a wet etching process and the etchant applied through the wet etching process preferably includes chlorine or more specifically the etchant could be selected from the group consisting of hydrochloric acid (HCl) and hydrogen peroxide ($H_2O_2$). Moreover, since the wet etching process is conducted while the substrate 12 or semiconductor wafer is being spun, the work function metal layers 40, 52 preferably form an asymmetric structure as a result of the centrifugal force from the spinning process.

Overall, the work function metal layer 40 after the etching process is conducted preferably includes a first U-shape and the first U-shape further includes a first end 62 and a second end 64, the work function metal layer 52 on the work function metal layer 40 includes a second U-shape and the second U-shape further includes a third end 66 and a fourth end 68, in which a top or topmost surface of the first end 62 is even with a top or topmost surface of the third end 66, a top or topmost surface of the second end 64 is even with a top or topmost surface of the fourth end 68, and both the first end 62 and the third end 66 are lower than the second end 64 and the fourth end 68.

Viewing from a more detailed perspective, the work function metal layer 40 preferably includes a vertical portion 46 on one side of the recess 42, a vertical portion 48 on another side of the recess 42, and a horizontal portion 50 connecting the vertical portion 46 and the vertical portion 48, and the work function metal layer 52 includes a vertical portion 70 on one side of the recess 42, a vertical portion 72 on another side of the recess 42, and a horizontal portion 74 connecting the vertical portion 70 and the vertical portion 72. Preferably, the top or topmost surface of the vertical portion 46 is even with the top or topmost surface of the vertical portion 70, the top or topmost surface of the vertical portion 48 is even with the top or topmost surface of the vertical portion 72, and the vertical portions 46, 70 and the vertical portions 48, 72 preferably have different heights. For instance, the height of the vertical portion 46 is slightly lower than the height of the vertical portion 48 and the height of the vertical portion 70 is slightly lower than the height of the vertical portion 72.

Next, as shown in FIG. 5, the patterned mask 44 is removed from the first region 102, and a low resistance metal layer 54 is formed in the recesses 42 on the first region 102 and second region 104 to fill the recesses 42 completely, and a planarizing process such as CMP is conducted to remove part of the low resistance metal layer 54, part of the work function metal layer 52, part of the work function metal layer 40, and part of the high-k dielectric layer 38 on the first region 102 and part of the low resistance metal layer 54 and part of the high-k dielectric layer 38 on the second region 104 for forming metal gates 56, 58 on the first region 102 and second region 104 respectively. Next, another etching process is conducted to remove part of the metal gates 56, 58 on the first region 102 and second region 104 to form recesses (not shown), a hard mask 60 made of dielectric material such as silicon nitride is formed in the recesses on top of the metal gates 56, 58, and a planarizing process such as CMP is conducted to remove part of the hard mask 60 so that the top surface of the remaining hard masks 60 is even with the top surface of the ILD layer 34. Next, contact plugs could be formed adjacent to two sides of each of the metal gates 56, 58 to directly contact the source/drain regions 26 depending on the demand of the process. This completes the fabrication of a semiconductor device according to an embodiment of the present invention.

Figure 6:
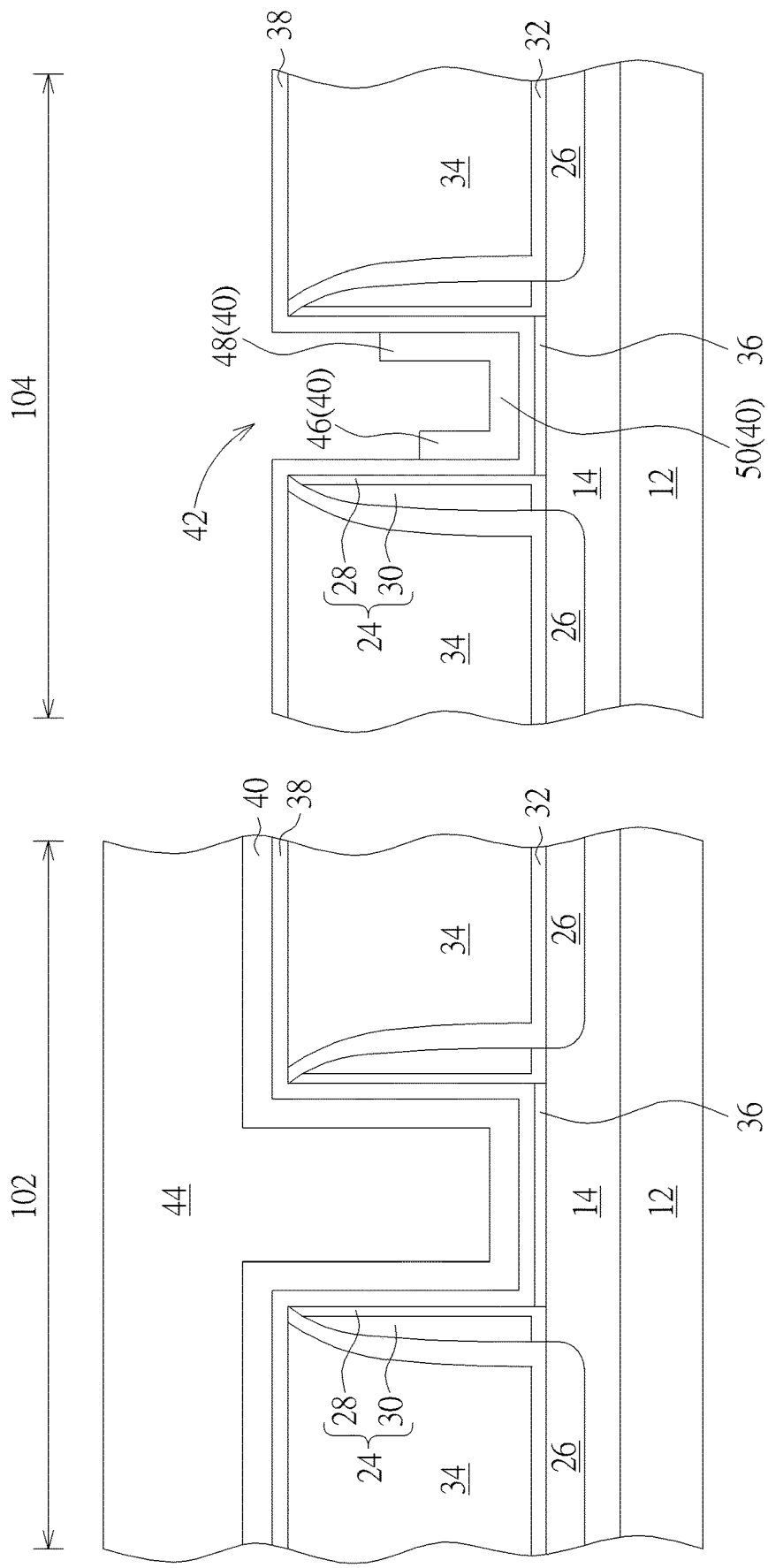
FIGS. 6-8 illustrate a method for fabricating a semiconductor device according to an embodiment of the present invention.
Figure 7:
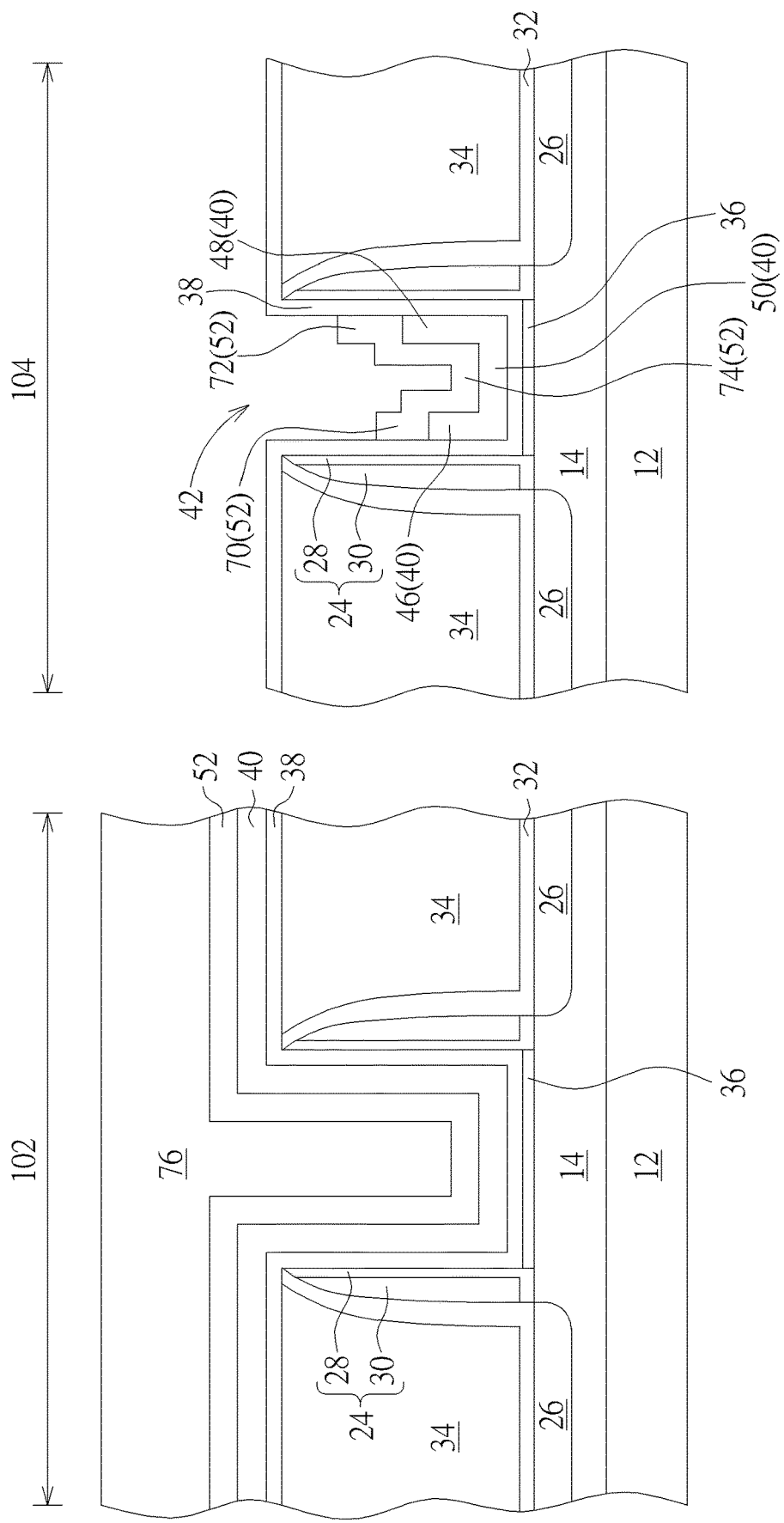
Figure 8:
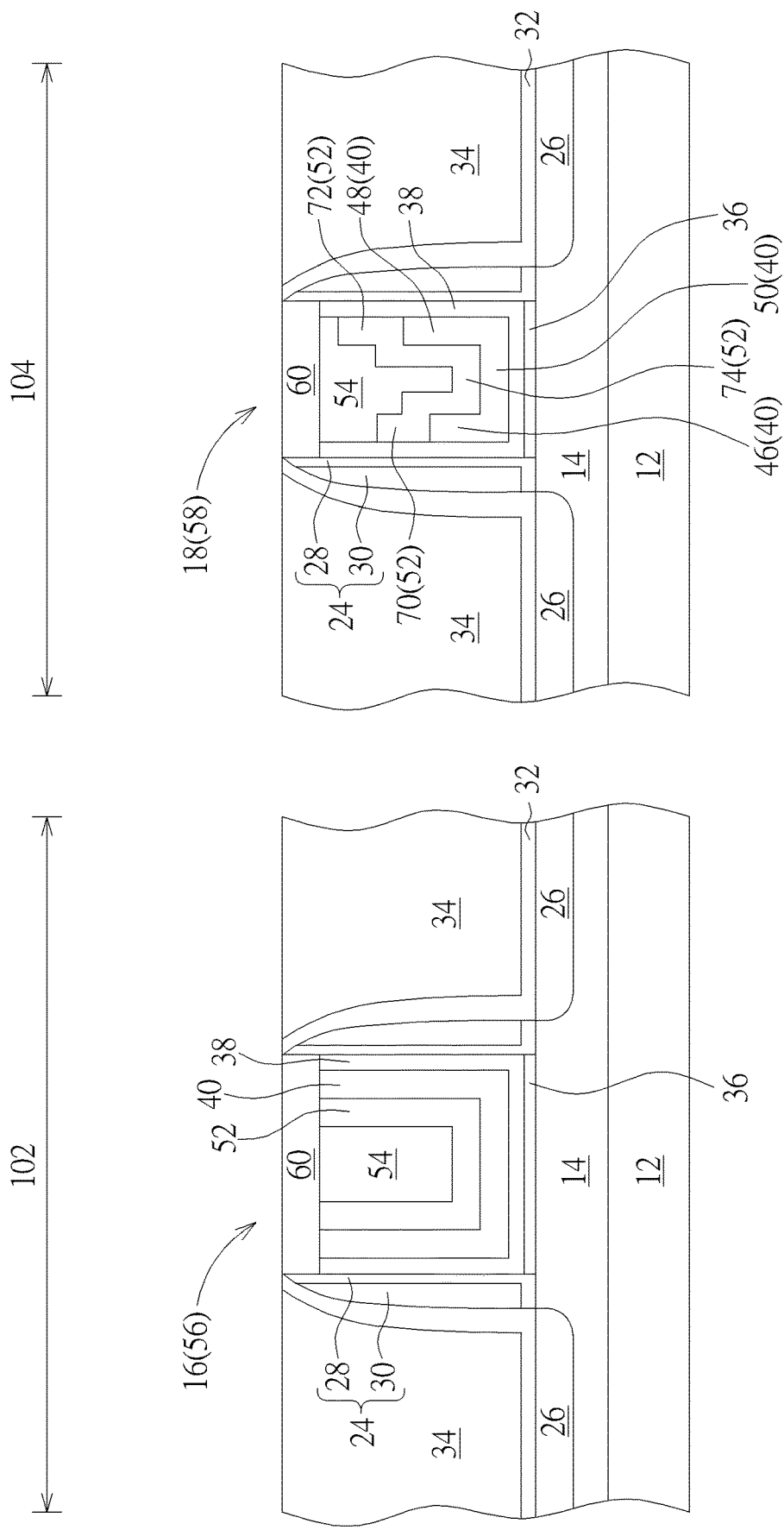

Referring to FIGS. 6-8, FIGS. 6-8 illustrate a method for fabricating a semiconductor device according to an embodiment of the present invention. As shown in FIG. 6, after the recesses 42 are formed in FIG. 2, it would be desirable to sequentially form a selective interfacial layer 36 or gate dielectric layer, a high-k dielectric layer 38, and a work function metal layer 40 into the recesses 42 on the first region 102 and second region 104, form a patterned mask 44 to cover the first region 102 and expose the work function metal layer 40 on the second region 104, and then using the patterned mask 44 as mask to remove part of the work function metal layer 40 on the ILD layer 34 so that the remaining work function metal layer 40 is slightly lower than the top surface of the ILD layer 34 or recesses 42.

Next, as shown in FIG. 7, after removing the patterned mask 44 on the first region 102, another work function metal layer 52 is formed into the recesses 42 on the first region 102 and second region 104, another patterned mask 76 is formed to cover the first region 102 and expose the work function metal layer 52 on the second region 104, and then an etching process is conducted by using the patterned mask 76 as mask to remove part of the work function metal layer 52 so that the remaining work function metal layer 52 is slightly lower than the top surface of the ILD layer 34 or recess 42. In contrast to the embodiment shown in FIGS. 4-5 of employing a single etching process to remove part of the work function metal layers 40, 52 at the same time, the present embodiment conducts additional etching process to remove part of the work function metal layers 40, 52 separately to form work function metal layers 40, 52 each having asymmetric heights.

Similar to the embodiment shown in FIG. 3, the etching process conducted at this stage to remove part of the work function metal layers 40, 52 preferably includes a wet etching process and the etchant applied through the wet etching process preferably includes chlorine or more specifically the etchant could be selected from the group consisting of hydrochloric acid (HCl) and hydrogen peroxide ($H_2O_2$). Moreover, since the wet etching process is conducted while the substrate 12 or semiconductor wafer is being spun, the work function metal layers 40, 52 preferably form asymmetric structures as a result of the centrifugal force from the spinning process. Viewing from a more detailed perspective, the work function metal layer 40 after the etching process preferably includes a vertical portion 46 on one side of the recess 42, a vertical portion 48 on another side of the recess 42, and a horizontal portion 50 connecting the vertical portion 46 and the vertical portion 48, and the work function metal layer 52 includes a vertical portion 70 on one side of the recess 42, a vertical portion 72 on another side of the recess 42, and a horizontal portion 74 connecting the vertical portion 70 and the vertical portion 72. Preferably, the vertical portions 46 and 48 of the work function metal layer 40 have different heights and the vertical portions 70 and 72 of the work function metal layer 52 also have different heights, in which the height of the vertical portion 46 is slightly lower than the height of the vertical portion 48 and the height of the vertical portion 70 is slightly lower than the height of the vertical portion 72.

Next, as shown in FIG. 8, the patterned mask 76 is removed from the first region 102, and a low resistance metal layer 54 is formed in the recesses 42 on the first region 102 and second region 104 to fill the recesses 42 completely, and a planarizing process such as CMP is conducted to remove part of the low resistance metal layer 54, part of the work function metal layer 52, part of the work function metal layer 40, and part of the high-k dielectric layer 38 on the first region 102 and part of the low resistance metal layer 54 and part of the high-k dielectric layer 38 on the second region 104 for forming metal gates 56, 58 on the first region 102 and second region 104 respectively. Next, another etching process is conducted to remove part of the metal gates 56, 58 on the first region 102 and second region 104 to form recesses (not shown), a hard mask 60 made of dielectric material such as silicon nitride is formed in the recesses on top of the metal gates 56, 58, and a planarizing process such as CMP is conducted to remove part of the hard mask 60 so that the top surface of the remaining hard masks 60 is even with the top surface of the ILD layer 34. Next, contact plugs could be formed adjacent to two sides of each of the metal gates 56, 58 to directly contact the source/drain regions 26 depending on the demand of the process. This completes the fabrication of a semiconductor device according to an embodiment of the present invention.

In this embodiment, the high-k dielectric layer 38 is preferably selected from dielectric materials having dielectric constant (k value) larger than 4. For instance, the high-k dielectric layer 38 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 40 is preferably a p-type work function metal layer having a work function ranging between 4.8 eV and 5.2 eV, in which the work function metal layer 40 may include titanium nitride (TiN), tantalum nitride (TaN), tantalum carbide (TaC), but it is not limited thereto. The work function metal layer 52 on the other hand is preferably a n-type work function metal layer having a work function ranging between 3.9 eV and 4.3 eV, in which the work function metal layer 52 may include titanium aluminide (TiAl), zirconium aluminide (ZrAl), tungsten aluminide (WAl), tantalumaluminide (TaAl), hafniumaluminide (HfAl), or titanium aluminum carbide (TiAlC), but it is not limited thereto. An optional barrier layer (not shown) could be formed between the work function metal layer 52 and the low resistance metal layer 54, in which the material of the barrier layer may include titanium (Ti), titanium nitride (TiN), tantalum (Ta) or tantalum nitride (TaN). Furthermore, the material of the low-resistance metal layer 54 may include copper (Cu), aluminum (Al), titanium aluminum (TiAl), cobalt tungsten phosphide (CoWP) or any combination thereof.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a metal gate on a substrate, wherein the metal gate comprises:
     a high-k dielectric layer on the substrate; and
     a first work function metal (WFM) layer, wherein the first WFM layer comprises:
       a first vertical portion;
       a second vertical portion, wherein the first vertical portion and the second vertical portion comprise different heights and contact the high-k dielectric layer directly; and
       a first horizontal portion connecting the first vertical portion and the second vertical portion.

2. The semiconductor device of claim 1, further comprising:
   a source/drain region adjacent to two sides of the metal gate;
   an interlayer dielectric (ILD) layer around the metal gate; and
   a hard mask on the metal gate, wherein a top surface of the hard mask is even with a top surface of the ILD layer.

3. The semiconductor device of claim 2, wherein the metal gate comprises:
   a second WFM layer on the first WFM layer; and
   a low resistance metal layer on the second WFM layer.

4. The semiconductor device of claim 3, wherein the first WFM layer comprises a p-type WFM layer and the second WFM layer comprises a n-type WFM layer.

5. The semiconductor device of claim 3, wherein the second WFM layer comprises:
   a third vertical portion;
   a fourth vertical portion; and
   a second horizontal portion connecting the third vertical portion and the fourth vertical portion.

6. The semiconductor device of claim 5, wherein top surfaces of the third vertical portion, the fourth vertical portion, and the low resistance metal layer are coplanar.

7. The semiconductor device of claim 5, wherein the third vertical portion and the fourth vertical portion comprise different heights.

8. The semiconductor device of claim 5, wherein a top surface of the third vertical portion is lower than a top surface of the low resistance metal layer and a top surface of the fourth vertical portion is even with the top surface of the low resistance metal layer.

9. A semiconductor device, comprising:
   a metal gate on a substrate, wherein the metal gate comprises:
     a first work function metal (WFM) layer, wherein the first WFM layer comprises a first U-shape and the first U-shape comprises a first end and a second end; and
     a second WFM layer on the first WFM layer, wherein the second WFM layer comprise a second U-shape, the second U-shape comprises a third end and a fourth end, top surfaces of the first end and the third end are coplanar, top surfaces of the second end and the fourth end are coplanar, and the first end is lower than the second end.

10. The semiconductor device of claim 9, further comprising:
    a source/drain region adjacent to two sides of the metal gate;
    an interlayer dielectric (ILD) layer around the metal gate; and
    a hard mask on the metal gate, wherein a top surface of the hard mask is even with a top surface of the ILD layer.

11. The semiconductor device of claim 9, wherein the metal gate comprises:

a high-k dielectric layer on the substrate; and
a low resistance metal layer on the second WFM layer.

12. The semiconductor device of claim 9, wherein the first WFM layer comprises a p-type WFM layer and the second WFM layer comprises a n-type WFM layer.

13. The semiconductor device of claim 9, wherein the first WFM layer comprises:
- a first vertical portion;
- a second vertical portion, wherein the first vertical portion and the second vertical portion comprise different heights; and
- a first horizontal portion connecting the first vertical portion and the second vertical portion.

14. The semiconductor device of claim 13, wherein the second WFM layer comprises:
- a third vertical portion, wherein top surfaces of the first vertical portion and the third vertical portion are coplanar;
- a fourth vertical portion, wherein top surfaces of the second vertical portion and the fourth vertical portion are coplanar and the third vertical portion and the fourth vertical portion comprise different heights; and
- a second horizontal portion connecting the third vertical portion and the fourth vertical portion.

* * * * *